(12) United States Patent
Chamberlin et al.

(10) Patent No.: US 6,426,466 B1
(45) Date of Patent: Jul. 30, 2002

(54) PERIPHERAL POWER BOARD STRUCTURE

(75) Inventors: Bruce J. Chamberlin, Kirkwood; John M. Lauffer, Waverly; James R. Stack, Endicott, all of NY (US)

(73) Assignee: International Business Machines Corporation, Armonk, NJ (US)

( * ) Notice: Subject to any disclaimer, the term of this patent is extended or adjusted under 35 U.S.C. 154(b) by 0 days.

(21) Appl. No.: 09/501,480

(22) Filed: Feb. 9, 2000

(51) Int. Cl.[7] ................................................ H05K 1/02
(52) U.S. Cl. ........................ 174/255; 174/261; 361/807; 361/808
(58) Field of Search .................... 174/255, 260, 174/262, 263, 264, 265, 266, 52.4, 261; 361/600, 829, 825, 807, 808, 809, 801; 439/71, 607

(56) References Cited

U.S. PATENT DOCUMENTS

| | | | |
|---|---|---|---|
| 3,316,618 A | | 5/1967 | Guarracini |
| 4,018,494 A | | 4/1977 | Scheingold et al. |
| 4,071,880 A | | 1/1978 | Rutt |
| 4,322,778 A | * | 3/1982 | Barbour et al. ............. 361/414 |
| 4,628,411 A | | 12/1986 | Balderes et al. |
| 4,685,033 A | * | 8/1987 | Inoue .......................... 361/414 |
| 5,016,138 A | | 5/1991 | Woodman |
| 5,060,369 A | | 10/1991 | Date |
| 5,086,372 A | | 2/1992 | Bennett et al. |
| 5,104,327 A | | 4/1992 | Walburn |
| 5,488,540 A | * | 1/1996 | Hatta .......................... 361/794 |
| 5,898,576 A | | 4/1999 | Lockwood et al. |
| 6,101,096 A | * | 8/2000 | MacGregor et al. ........ 361/720 |
| 6,195,883 B1 | * | 3/2001 | Bhatt et al. .................... 29/852 |
| 6,239,972 B1 | * | 5/2001 | Tehan et al. ................ 361/704 |

FOREIGN PATENT DOCUMENTS

EP          0 037 621       10/1981

* cited by examiner

Primary Examiner—Albert W. Paladini
(74) Attorney, Agent, or Firm—Schmeiser, Olsen & Watts; Howard J. Walter, Jr.

(57) ABSTRACT

A printed wiring board structure having peripheral power input. A printed wiring board having internal conductive layers, wherein each internal conductive layer contains a plurality of tabs extending therefrom. Tabs of similar voltage are vertically aligned within the printed wiring board. A frame within which the printed wiring board is mounted is also provided. The frame, having connections mounted within an inner surface of the frame, electrically contacts the tabs along the periphery of the printed wiring board.

24 Claims, 3 Drawing Sheets

PERIPHERAL POWER BOARD STRUCTURE

BACKGROUND OF THE INVENTION

1. Technical Field

The present invention relates generally to printed wiring board technology, and more particularly, to a printed wiring board wherein the power input is supplied to the board along the periphery of the board.

2. Related Art

Technology demands smaller semiconductor devices having higher functionality, which typically results in more densely packed printed wiring boards. The amount of space on the surface of the board available to mount active components becomes scarce as the complexity of the device increases. A significant user of printed wiring board surface space is the input power. Typically, numerous plated through holes are needed within the board to provide input power. In addition to eliminating a large amount of surface space, the plated through holes also significantly reduce the amount of wiring channels available for connecting power planes within the board. In addition, high end printed wiring boards typically require power busses to improve power distribution throughout the board, which also monopolize a large portion of the board surface. This means that a significant amount of printed wiring board surface area is devoted to the power supply.

Accordingly, there exists a need in the industry for a printed wiring board capable of solving the above-mentioned problems.

SUMMARY OF THE INVENTION

The present invention solves the above-stated problems by providing a peripheral power board structure. In particular, the present invention provides a printed wiring board and frame, wherein the input power is supplied at the periphery of the board.

The first general aspect of the present invention provides a printed wiring board structure comprising: a frame having a connection device attached to a first surface of the frame; and a printed wiring board having first and second adjacent surfaces, wherein the second surface includes a contacting surface which electrically contacts the connection device of the frame. This aspect provides the necessary input power at the periphery of the board, thereby increasing the amount of surface space available on the board for the attachment of other components. This aspect eliminates the plated through holes conventionally used to supply input power, since the input power is supplied along the edges of the board. This aspect also increases the power distribution throughout the board since there are numerous locations around the periphery of the board designed to receive and distribute input power, thereby reducing the number of surface busses used for power distribution.

The second general aspect provides a printed wiring board structure comprising: a printed wiring board having first and second adjacent surfaces; and a frame, including a connection device, wherein the connection device provides input power to the board at the second surface of the board. This aspect provides similar advantages as those associated with the first aspect.

The third general aspect provides a printed wiring board comprising: a substrate having first and second adjacent surfaces; a circuitized layer on the first surface; and an internal conductive layer, wherein portions of the internal conductive layer are exposed at the second surface and adapted to make electrical connection at the second surface. This aspect provides a printed wiring board having similar advantages as those associated with the first aspect.

The fourth general aspect provides a printed wiring board frame comprising: at least one connection device within an inner surface of the frame, providing input power at a periphery of a printed wiring board. This aspect provides a frame having similar advantages as those associated with the first aspect.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 1:
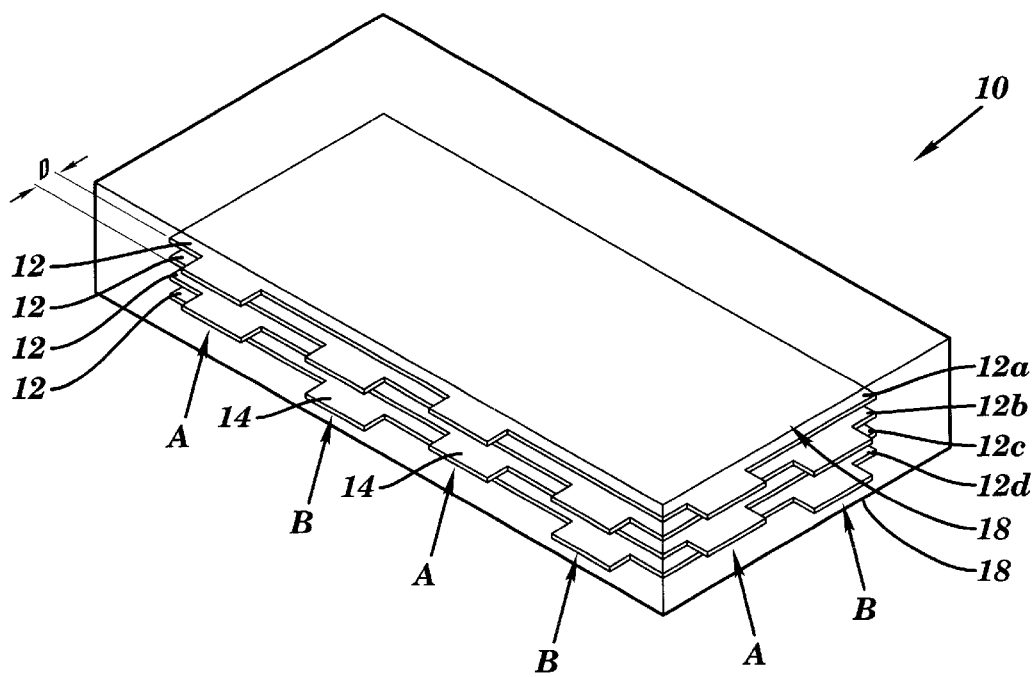
FIG. 1 depicts a composite printed wiring board in accordance with a preferred embodiment of the present invention.

Referring to the drawings, FIG. 1 shows a composite printed circuit or wiring board 10. The board 10 is constructed of a plurality of internal conductive layers or cores 12. Each core 12 preferably comprises a dielectric substrate or sheet surrounded by a conductive plating. The dielectric sheet is preferably an epoxy glass material, or in the alternative, a polyimide material, non-glass reinforced epoxy, non-glass polyimide material, etc. The conductive plating is preferably copper, or in the alternative, copper having overlays of nickel, gold, tin-lead, etc. The copper plating is applied to the dielectric sheet using conventional deposition techniques. For example, an electroless palladium seed layer may be deposited over the dielectric sheet. The copper may then be electroless plated over the seed layer. The cores 12 preferably have a thickness in the range of approximately 1.5 mils to 6 mils.

A plurality of extensions or tabs 14 are formed on each core 12 using typical photolithography techniques. For instance, a layer of photoresist may be deposited over each core 12. The photoresist may then be exposed and developed, leaving the desired tab 14 pattern on the surface of the core 12. The cores 12 are then etched, using well known etching techniques, such as a cupric chloride or ammoniacal etch, leaving the tabs 14 around the perimeter of each core 12. The tabs 14 have a depth D, or extend away from the core 12, in the range of approximately 0.2 inches to approximately 2.0 inches, depending upon the dimensions of the board 10.

Each core 12 is patterned, via conventional photolithography techniques, to form signal planes, power planes, voltage planes, ground planes, etc., as needed. For example, a layer of photoresist may be deposited over each core 12. The photoresist may then be exposed and developed to form the desired circuit pattern on the surface of the core 12. Each core 12 is then etched, using for example, a cupric chloride or ammoniacal etch, to form circuitized cores 12.

The circuitized cores 12 are vertically stacked with a layer of laminate 18, preferably epoxy glass, therebetween separating each core 12. A layer of laminate 18 is also placed on the top and bottom of the stack of cores 12. In the alternative, the laminate 18 may comprise polyimide materials, non-glass reinforced epoxy, non-glass polyimide materials, etc. The cores 12 and the layers of laminate 18 are then laminated together, e.g., exposed to heat and pressure, to form the composite board 10. The layers of laminate 18 are preferably larger in length and width than the cores 12. This allows the layers of laminate 18 to completely surround and encapsulate the cores 12 upon lamination.

It should be noted that each core 12 is circuitized to carry a specified voltage. For instance, core 12a and core 12c are formed to carry a first voltage. Likewise, core 12b and core 12d are formed to carry a second voltage. Accordingly, the tabs 14 of each core 12 are positioned along the edge of each core 12, based upon the designated voltage level of each core 12. In other words, the cores 12 designated to carry the first voltage, namely cores 12a and 12c, have tabs 14 formed in a location corresponding to locations designated A. Similarly, the cores 12 designated to carry the second voltage, cores 12b and 12d, have tabs 14 formed in a location corresponding to locations B. Therefore, the tabs 14 carrying like voltage levels will be vertically aligned when the cores 12 are stacked and laminated.

Figure 2:
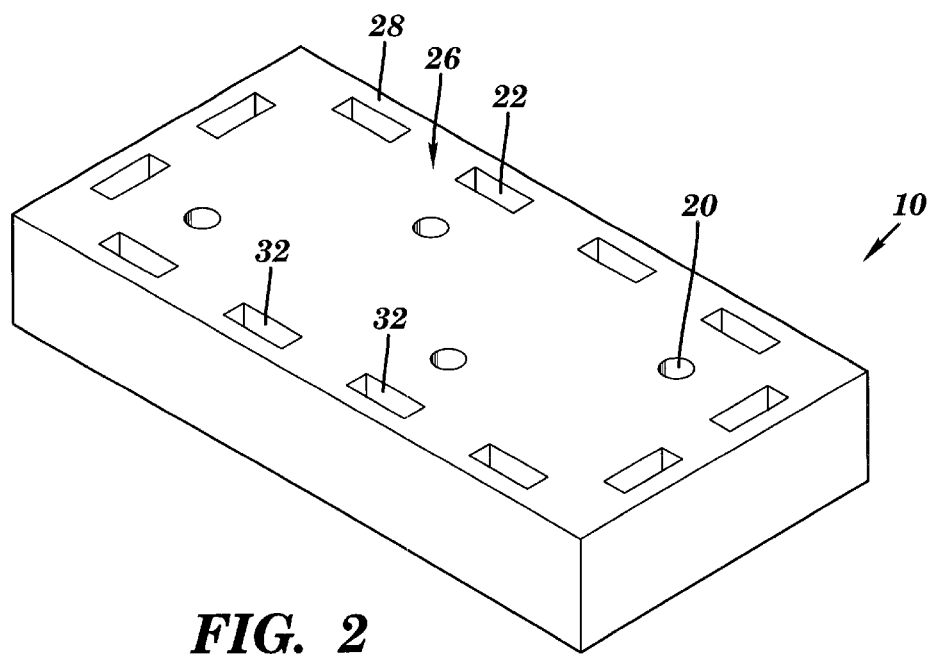
FIG. 2 depicts the composite printed wiring board having holes and slots formed therein in accordance with a preferred embodiment of the present invention.

As shown in FIG. 2, a plurality of holes 20 are formed within the board 10, preferably by a conventional drilling process. A plurality of slots 22 are formed around the perimeter of the board 10. The slots 22 are preferably formed via a conventional drilling or routing process. The slots 22 are formed in regions of the board 10 corresponding to the location of the stacked tabs 14. In particular, the inner surface of the slots 22, the surface nearest the center of board 10, actually contacts the edge of the tabs 14. The slots 22 preferably have a width approximately equal to the width of the tabs 14. However, slots having a width more than or less than that of the tabs 14 may also be used.

The holes 20 and slots 22 are then cleaned using conventional cleaning techniques, such as a hole clean desmear process, to remove any debris produced during the formation of the holes 20 and slots 22. The board 10 is then plated, preferably with copper, using conventional plating techniques. For instance, an electroless palladium seed is deposited over the board 10, holes 20, and slots 22. A layer of copper is electroless plated over the seed layer. The plated through holes 20 provide the board 10 with the necessary connections between the internal cores 12, i.e., signal planes. The plating within the slots 22 contacts the edges of the tabs 14 within the inner surface of the slots 22. This electrically connects, or ties the tabs 14 together that are vertically aligned within each slot 22. Accordingly, an electrical contacting surface 32 (also refer to FIG. 4) is formed along the inner surface of the slots 22. As a result, the voltage level of each electrical contacting surface 32 is equal to the voltage level of the respective tabs 14 vertically tied by the plating within that slot 22.

Figure 3:
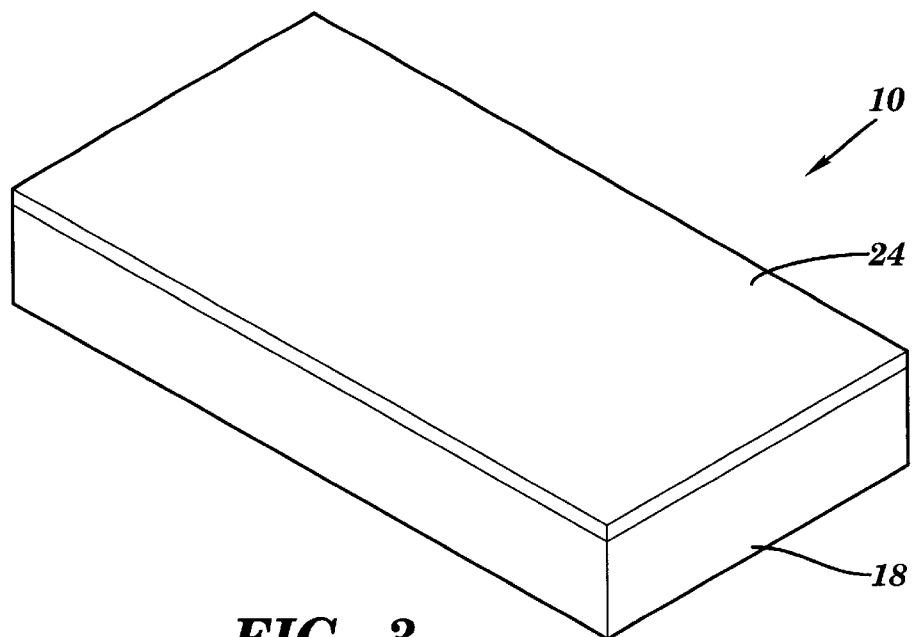
FIG. 3 depicts the composite printed wiring board having a layer of photoresist thereover in accordance with a preferred embodiment of the present invention.

The surface of the board 10 is then circuitized, in a conventional manner, to form an outer layer of circuitry. In particular, a layer of photoresist 24 is deposited over the surface of the board 10, as shown in FIG. 3. The plated through holes 20 and slots 22 (FIG. 2) are tented by the photoresist 24. In other words, the layer of photoresist 24 covers the plated through holes 20 and slots 22, thereby preventing the copper plating therein from being removed during the subsequent etching step. The layer of photoresist 24 is then exposed and developed to pattern the board 10. The board 10 is etched, using conventional techniques, such as cupric chloride or ammoniacal etching, to form external wiring on the board 10. The layer of photoresist 24 is removed via conventional cleaning processes.

Figure 4:
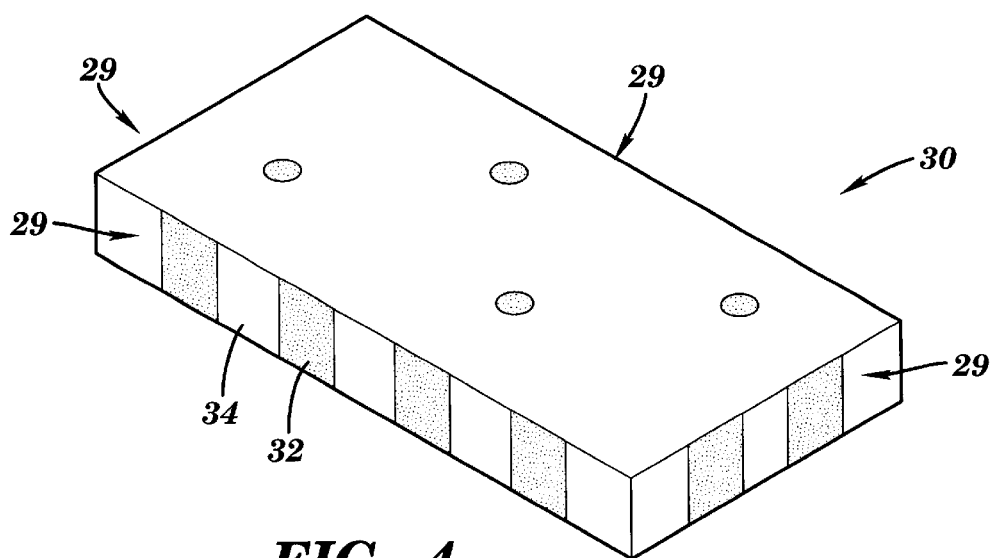
FIG. 4 depicts a printed wiring board in accordance with a preferred embodiment of the present invention.

The board 10 is then profiled to form a printed circuit or wiring board 30, as shown in FIG. 4. Specifically, the bridges 26 connecting the outer ring 28 of the board, produced during the formation of the slots 22 (FIG. 2), are cut. After the outer ring 28 is removed, the electrical contacting surfaces 32 remain along the periphery of the board 30. The periphery refers to surfaces or sides 29 of the board 30. Areas of isolation 34 are formed between each electrical contacting surface 32. The areas of isolation 34 correspond to the location of the bridges 26. The areas of isolation 34 are composed of the laminate 18 material surrounding the cores 12. This is because the bridges 26 of the outer ring 28 prevented the areas of isolation 34 from being copper plated while the board 10, holes 20 and slots 22 were plated in a previous step.

Figure 5:
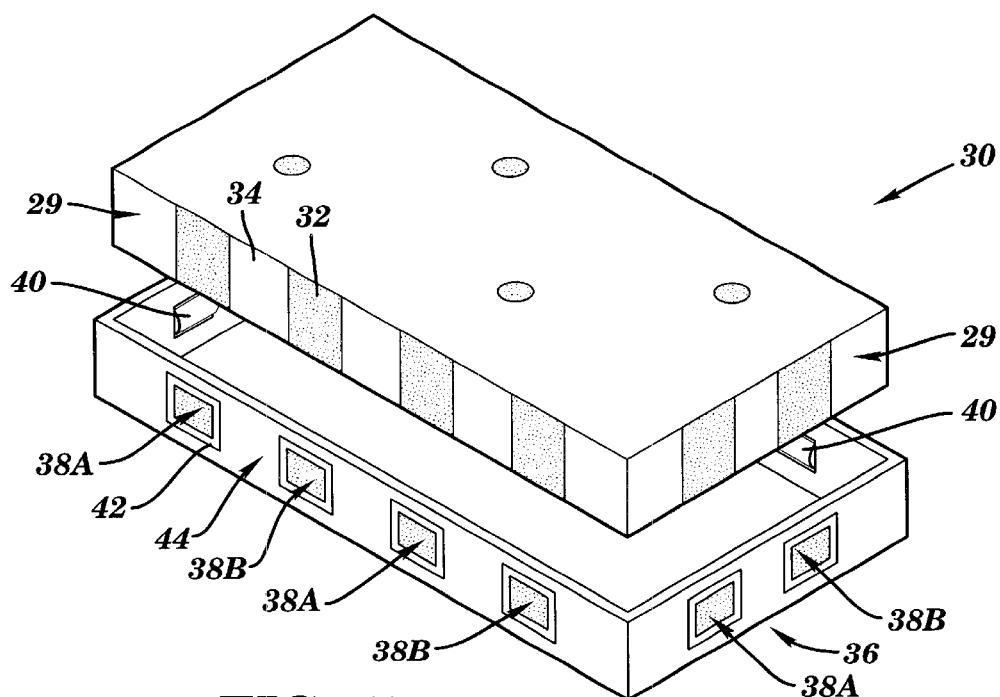
FIG. 5 depicts the printed wiring board and a frame in accordance with a preferred embodiment of the present invention.
Figure 6:
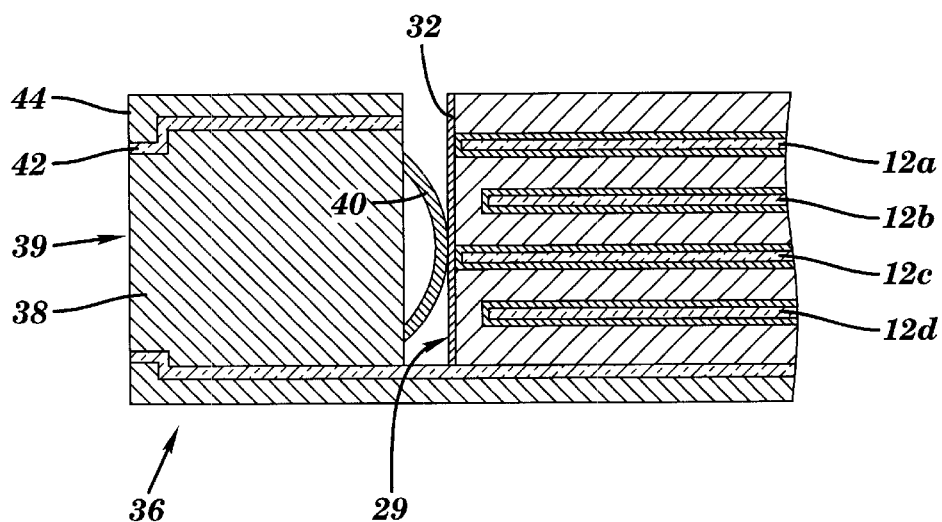
FIG. 6 depicts an enlarged cross-sectional view of the frame and printed wiring board in accordance with a preferred embodiment of the present invention.

The printed wiring board 30 is mounted within a carrier or frame 36, as shown in FIG. 5. As illustrated in FIG. 6, the frame 36 preferably includes at least one conductive core 38, which transmits input power to the printed wiring board 30. The conductive core 38 may be formed via molding, stamping, casting, machining, etc., and is preferably copper, but may be formed from any metal, such as aluminum, nickel, copper, etc. An insulative layer 42, preferably epoxy glass, is deposited over the conductive core 38. In the alternative, the insulative layer 42 may comprise polyimide materials, non-glass reinforced epoxy, non-glass polyimide materials, etc. A layer of conductive material 44, preferably a metal such as, aluminum, copper, nickel, etc., is deposited over the insulative layer 42. In regions corresponding to the locations of each of the contacting surfaces 32, the insulative layer 42 and the layer of conductive material 44 do not cover the conductive core 38, as shown in FIG. 5. In these regions the conductive core 38 extends from the inner surface of the frame 36 to the outer surface of the frame 36 (FIG. 6). This facilitates the supply of individualized input power to contacting surfaces 32 in specific locations A, B of the board 30. In particular, a first voltage is applied to the conductive surface 39 of each conductive core 38A, which corresponds to the tabs 14 of cores 12a and 12c in locations A (refer to FIG. 1). Likewise, a second voltage is applied to the conductive surface 39 of each conductive core 38B, which corresponds to the tabs 14 of cores 12b and 12d in locations B.

A plurality of connection devices 40, comprising a conductive material, preferably metal, are mechanically attached, i.e., via welding, soldering, gluing, screwing, etc., to the conductive core 38 within the interior surface of the frame 36. In this example, the connection devices 40 are springs, constructed of nickel, Kovar™ (Carpenter Technologies Corporation), a tin-lead or gold plated metal, etc. In the alternative, the connection devices 40 may be tabs, or other forms of extensions obvious to those skilled in the art. Further, the connection devices 40 may alternatively be formed within the frame 36 during fabrication rather than being mechanically attached during a subsequent step.

The connection devices 40 are located on the interior surface of the frame 36 corresponding to the location of each electrical contacting surface 32. The connection devices 40 transmit the appropriate input power from the frame 36 to the board 30. Specifically, an outside power sources (not shown) supplies the appropriate input power to the conductive surface 39 of each conductive core 38. The input power is transmitted through the conductive core 38 to the connection device 40. Each connection device 40 transmits the input power to the electrical contacting surfaces 32 along the periphery (surface 29) of the printed wiring board 30, wherein the tabs 14 subsequently transmit the input power to the cores 12 connected thereto. In short, the connection devices 40 within the frame 36 provide the printed wiring board 30 with the requisite input power at the periphery of the board 30 (surfaces 29). This type of peripheral connection leaves sufficient surface space for other components, such as logic and memory devices, passive components, etc.

It should be noted that the present invention reduces the number of plated through holes 20 necessary within the device. In a typical printed wiring board plated through holes are needed to supply the board with input power, to connect the signal wires within different cores 12, and supply output power to components mounted thereon. Since the peripheral connection devices 40 supply the board 30 with input power, the need for input power plated through holes 22 is eliminated. Accordingly, the number of plated through holes within the board is significantly reduced.

It should also be noted that the power distribution within the printed wiring board 30 is increased using the present invention. This is attributable to the electrical contacting surface 32. Rather than supplying input power through a narrow plated through hole, as is conventional, the input power is supplied at numerous locations around the periphery of the board 30. Additionally, the surface area of each electrical contacting surface 32 is typically greater than that of a conventional plated through hole, thereby increasing power distribution.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A printed wiring board structure comprising:
    a frame having a conductive core extending from a first surface to a second surface of the frame, an insulative layer on the conductive core, a conductive material on the insulative layer, and a connection device attached to a first surface of the frame; and
    a printed wiring board received within the frame having first and second adjacent surfaces, wherein the second surface includes a contacting surface which electrically contacts the connection device of the frame.

2. The printed wiring board structure of claim 1, wherein the conductive core of the frame comprises a material selected from the group consisting of: aluminum, nickel and copper.

3. The printed wiring board structure of claim 1, wherein the insulative layer of the frame comprises epoxy glass.

4. The printed wiring board structure of claim 1, wherein the conductive layer of the frame comprises a material selected from the group consisting of: aluminum, nickel and copper.

5. The printed wiring board structure of claim 1, wherein the connection device comprises a conductive material.

6. The printed wiring board structure of claim 1, wherein the connection device comprises a spring.

7. The printed wiring board structure of claim 1, wherein input power is supplied to the printed wiring board at the second surface of the board.

8. The printed wiring structure of claim 1, wherein the printed wiring board further comprises:
    an internal conductive layer, wherein a portion of the internal conductive layer extends to contact the second surface, forming the contacting surface; and
    an insulative material surrounding the internal conductive layer.

9. The printed wiring board structure of claim 8, wherein the internal conductive layer comprises a dielectric substrate and a conductive plating thereover.

10. The printed wiring board structure of claim 9, wherein the dielectric substrate comprises an epoxy glass material.

11. The printed wiring board structure of claim 9, wherein the conductive plating comprises copper.

12. A printed wiring board structure comprising:
    a printed wiring board having first and second adjacent surfaces; and
    a frame receiving the printed board therein, including a conductive core extending from a first surface to a second surface of the frame, an insulative layer on the conductive core, a conductive material on the insulative layer, and a connection device, wherein the connection device provides input power to the board at the second surface of the board.

13. The printed wiring board structure of claim 12, wherein the printed wiring board further comprises:
    an internal conductive layer, wherein a portion of the internal conductive layer extends to contact the second surface; and
    an insulative material surrounding the internal conductive layer.

14. The printed wiring board structure of claim 12, wherein the connection device comprises a spring.

15. A printed wiring board comprising:
    a substrate having first and second adjacent surfaces;
    a circuitized layer on the first surface;
    a first internal conductive layer, wherein a plurality of tabs extending from the first internal conductive layer are exposed at the second surface and adapted to make electrical connection at the second surface and carry a first voltage; and
    a second internal conductive layer, wherein a plurality of tabs extending from the second internal conductive layer are exposed at the second surface and adapted to make electrical connection at the second surface and carry a second voltage.

16. The printed wiring board of claim 15, wherein the first and second internal conductive layers comprise a dielectric substrate and a conductive plating thereover.

17. The printed wiring board of claim 16, wherein the dielectric substrate comprises an epoxy glass material.

18. The printed wiring board of claim 16, wherein the conductive plating comprises copper.

19. The printed wiring board of claim 15, wherein the printed wiring board is mounted within a frame.

20. The printed wiring board of claim 19, wherein the frame further includes:
- a conductive core having first and second surfaces, wherein the first surface includes the connection device, and the second surface extends to a surface of the frame to receive input power;
- an insulative layer over the conductive core;
- a conductive layer over the insulative layer; and
- a connection device mounted within an inner surface of the frame, whereby the connection device transmits input power to the printed wiring board.

21. The printed wiring board of claim 20, wherein the connection device comprises a spring.

22. The printed wiring board of claim 21, wherein the spring comprises a metallic material.

23. A printed wiring board frame comprising:
- a conductive core extending from a first surface to a second surface of the frame;
- an insulative layer on the conductive core;
- a conductive material on the insulative layer; and
- a connection device extending from the second surface of the frame, providing input power at a periphery of a printed wiring board.

24. A printed wiring board comprising:
- a first circuitized surface; and
- a second adjacent surface having first areas of electrical contact formed by a plurality of tabs extending from a first internal conductive layer, and second areas of electrical contact formed by a plurality of tabs extending from a second internal conductive layer, and wherein the first areas of electrical contact carry a first voltage and the second areas of electrical contact carry a second voltage.

* * * * *